United States Patent
Liang et al.

(10) Patent No.: US 9,484,537 B2
(45) Date of Patent: Nov. 1, 2016

(54) ORGANIC PHOTO DIODE WITH DUAL ELECTRON BLOCKING LAYERS

(71) Applicant: TAIWAN SEMICONDUCTOR MANUFACTURING COMPANY, LTD., Hsinchu (TW)

(72) Inventors: Chin-Wei Liang, Zhubei (TW); Hsing-Lien Lin, Hsinchu (TW); Cheng-Yuan Tsai, Chu-Pei (TW); Chia-Shiung Tsai, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/012,789

(22) Filed: Aug. 28, 2013

(65) Prior Publication Data

US 2015/0060775 A1 Mar. 5, 2015

(51) Int. Cl.
*H01L 29/08* (2006.01)
*H01L 51/00* (2006.01)
*H01L 51/42* (2006.01)

(52) U.S. Cl.
CPC ......... *H01L 51/002* (2013.01); *H01L 51/4246* (2013.01); *H01L 51/4253* (2013.01); *H01L 51/0036* (2013.01); *H01L 51/0046* (2013.01); *Y02E 10/549* (2013.01)

(58) Field of Classification Search
CPC .................. H01L 27/307; H01L 51/0047
USPC ............................................. 257/40
See application file for complete search history.

(56) References Cited

U.S. PATENT DOCUMENTS

| | | | | |
|---|---|---|---|---|
| 2006/0289882 A1* | 12/2006 | Nishimura | ............. | C09K 11/06 257/94 |
| 2007/0040494 A1* | 2/2007 | Su | ........................ | H01L 51/5048 313/506 |
| 2007/0141396 A1* | 6/2007 | Chun | ...................... | H01L 27/32 428/690 |

(Continued)

FOREIGN PATENT DOCUMENTS

| | | |
|---|---|---|
| JP | 2010-199101 | 9/2010 |
| JP | 2011-035243 | 2/2011 |

OTHER PUBLICATIONS

NPL Machine Translation 2010-199101.*

(Continued)

*Primary Examiner* — Trung Q Dang
*Assistant Examiner* — Patricia Reddington
(74) *Attorney, Agent, or Firm* — Haynes and Boone, LLP

(57) ABSTRACT

Embodiments of forming an image sensor with an organic photodiode are provided. The organic photodiode uses dual electron-blocking layers formed next to the anode of the organic photodiode to reduce dark current. By using dual electron-blocking layers, the values of highest occupied molecular orbital (HOMO) for the neighboring anode layer and the organic electron-blocking layer are matched by one of the dual electron-blocking layers to form a photodiode with good performance. The values of the lowest occupied molecular orbital (LOMOs) of the dual electron-blocking layers are selected to be lower than the neighboring anode layer to reduce dark current.

19 Claims, 5 Drawing Sheets

(56) References Cited

U.S. PATENT DOCUMENTS

| | | | |
|---|---|---|---|
| 2009/0165854 A1 | 7/2009 | Yamazaki et al. | |
| 2010/0089452 A1* | 4/2010 | Suzuki | B82Y 10/00 |
| | | | 136/263 |
| 2010/0102303 A1 | 4/2010 | Nomura et al. | |
| 2010/0224252 A1* | 9/2010 | Scharber | C08G 61/123 |
| | | | 136/263 |
| 2012/0038014 A1* | 2/2012 | Tai | H01L 27/14638 |
| | | | 257/437 |
| 2012/0097249 A1* | 4/2012 | Klenkler | H01L 51/0078 |
| | | | 136/263 |
| 2012/0267619 A1* | 10/2012 | Yamada et al. | 257/40 |
| 2014/0167002 A1* | 6/2014 | Welch | C07D 498/04 |
| | | | 257/40 |

OTHER PUBLICATIONS

NPL Machine Translation 2011-35243.*
Gunes, Serap, et al., "Conjugated Polymer-Based Organic Solar Cells", Chem. Rev. 2007, 107, 1324-1338.
Baierl, Daniela, et al., "A Hybrid CMOS-Imager with a Solution-Processable Polymer as Photoactive Layer", Nature Communications, Nov. 6, 2012, Macmillan Publishers, Limited, pp. 1-8.
Korean Intellectual Propery Office, Korean Office Action dated Apr. 21, 2015 for application 10-2014-0104591, 11 pages.
Korean Intellectual Propery Office, Korean Office Action dated Nov. 30, 2015 for application 10-2014-0104591, 15 pages.

* cited by examiner

| ELECTRON-BLOCKING LAYER(S) NEXT TO ANODE | (I) PEDOT=PSS | (II) 10nm $V_2O_5$ | (III) 10nm $MoO_3$ | (IV) 10nm $V_2O_5$ 2nm $MoO_3$ |
|---|---|---|---|---|
| DARK CURRENT DENSITY (BIAS=-1V) (A/cm$^2$) | 1.2 E-6 | 3.4 E-7 | 1.9 E-6 | 7.8 E-8 |
| PHOTO CURRENT DENSITY (BIAS=-1V) (mA/cm$^2$) | 10.0 | 6.0 | 9.2 | 8.6 |
| EQE ($\lambda$ = 550nm, BIAS=-1V) | 0.51 | 0.48 | 0.58 | 0.53 |
| RESPONSIVITY ($\lambda$ = 550nm, BIAS=-1V) | 0.22 | 0.21 | 0.26 | 0.24 |
| DETECTIVITY ($\lambda$ = 550nm, BIAS=-1V) | 3.6 E11 | 6.4 E11 | 3.2 E11 | 1.5 E12 |
| $\rho$(SIGNAL TO NOISE RATIO) (cm$^2$/A) (0V- 1V) | 74.2 E5 | 74.4 E6 | 73.1 E5 | 76.8 E6 |

FIG. 5

ORGANIC PHOTO DIODE WITH DUAL ELECTRON BLOCKING LAYERS

RELATED APPLICATIONS

The present application is related to U.S. application Ser. No. 14/012,713 entitled "Image Sensors with Organic Photodiodes and Methods for Forming the Same," filed on Aug. 28, 2013, and U.S. application Ser. No. 14/012,692 entitled "Organic Photosensitive Device with an Electron-Blocking and Hole-Transport Layer," filed on Aug. 28, 2013. The above-mentioned applications are incorporated herein by reference in their entireties. The present application and the above-mentioned applications were filed on the same date.

BACKGROUND

Image sensor chips, which include front side illumination (FSI) image sensor chips and Backside Illumination (BSI) image sensor chips, are widely used in applications such as cameras. In the formation of image sensor chips, image sensors (such as photo diodes) and logic circuits are formed on a silicon substrate (or a wafer), followed by the formation of an interconnect structure on a front side of the wafer. In the front side image sensor chips, color filters and micro-lenses are formed over the interconnector structure. In the formation of the BSI image sensor chips, after the formation of the interconnect structure, the wafer is thinned, and backside structures such as color filters and micro-lenses are formed on the backside of the silicon substrate. When the image sensor chips are used, light is projected on the image sensors, in which the light is converted into electrical signals.

The image sensors in the image sensor chips generate electrical signals in response to the stimulation of photons. Quantum efficiency (QE) of a photosensitive device measures the percentage of photons hitting device's photoreactive surface that produce charge carriers. Image sensors may suffer from dark current. Photosensitive devices with high QEs and low dark current are desirable.

BRIEF DESCRIPTION OF THE DRAWINGS

For a more complete understanding of the embodiments, and the advantages thereof, reference is now made to the following descriptions taken in conjunction with the accompanying drawings, in which:

FIG. 5 is a table of performance data of various electron-blocking layer(s) for an organic photodiode similar to the one described above in FIG. 3, in some embodiments.

DETAILED DESCRIPTION OF ILLUSTRATIVE EMBODIMENTS

Figure 1:
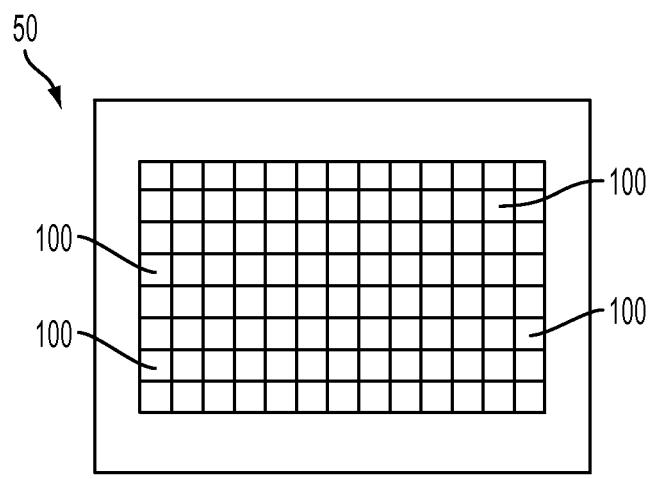
FIG. 1 is a top view of an image sensor, in accordance with some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, an image sensor 50 provides a grid of pixels 100, for example front side illuminated (or front-illuminated) pixels, in accordance with some embodiments. In at least the present embodiment, the pixels 100 are photosensitive diodes or photodiodes, for recording an intensity or brightness of light on the diode. In some embodiments, a minimum width of a pixel 100 is in a range from about 0.75 µm to about 1.4 µm. The pixels 100 may include reset transistors, source follower transistors, and transfer transistors, etc. The image sensor 50 can be of various different types of sensors, including a charge-coupled device (CCD), a complimentary metal oxide semiconductor (CMOS) image sensor (CIS), an active-pixel sensor (ACP), or a passive-pixel sensor. Recently, organic photodetectors (sensors of light), such as image sensors made with organic semiconductor materials (non-silicon based material) are being developed and used due to low manufacturing cost. Such organic semiconductor materials can also be easily integrated with CMOS process technology. Additional devices and circuitry are typically provided adjacent to the grid of pixels 100 for providing an operation environment for the pixels and for supporting external communications with the pixels. The additional devices and circuitry are made by CMOS process technology. As a result, image sensors using organic photodetectors with CMOS process technology are called hybrid CMOS image sensors.

As mentioned above, organic semiconductor materials are attractive due to low manufacturing cost. However, the existing image sensors using organic semiconductor materials either have low quantum efficiency (QE) or high dark current. As a result, there is a need for image sensors using organic semiconductor materials with high QE and low dark current.

Figure 2:
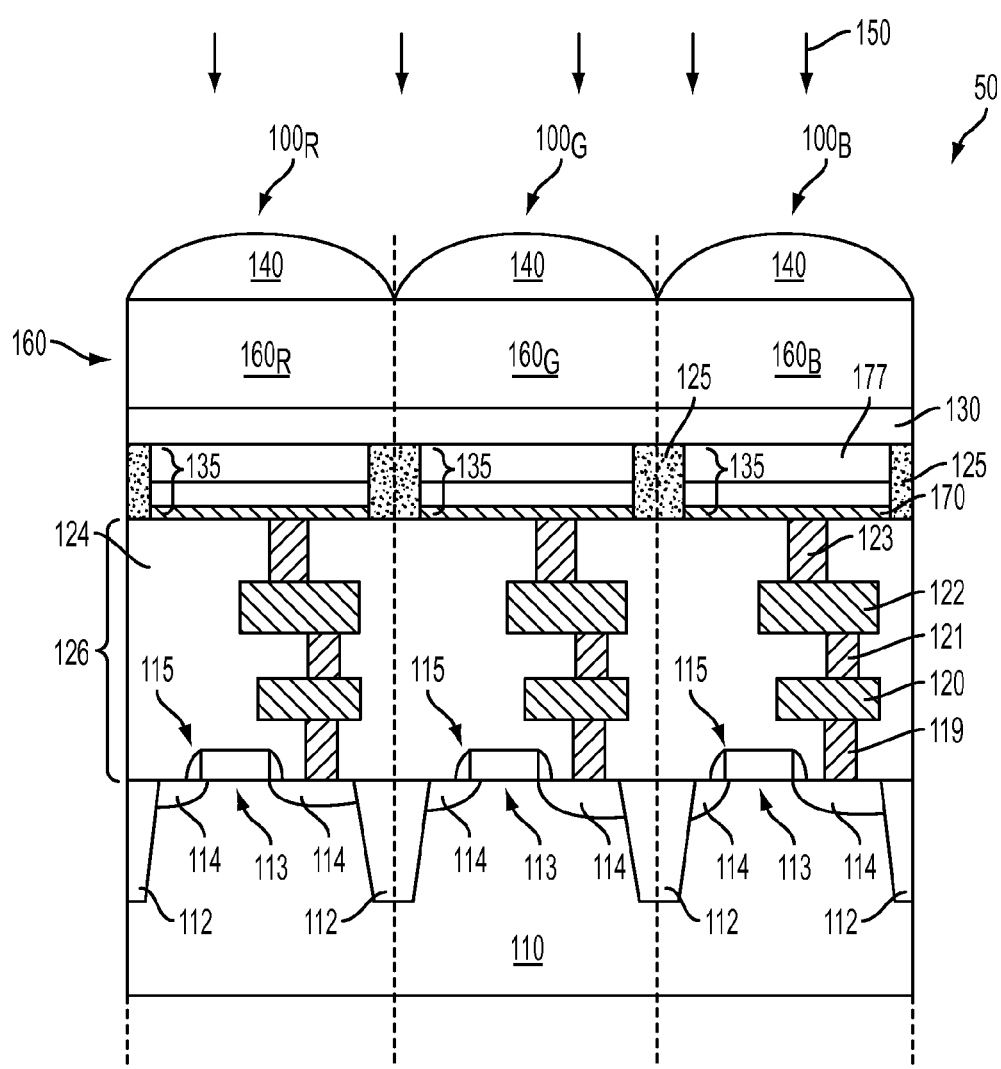
FIG. 2 is a cross-sectional view of the image sensor of FIG. 1, in accordance with some embodiments.

FIG. 2 is a cross-sectional view of image sensor 50, in accordance with some embodiments. Sensor 50 includes a silicon substrate 110, in accordance with some embodiments. Alternatively, the substrate 110 may comprise an elementary semiconductor such as silicon, germanium, and diamond. The substrate 110 may also comprise a compound semiconductor such as silicon carbide, gallium arsenic, indium arsenide, and indium phosphide. Also, semiconductor arrangements such as silicon-on-insulator and/or an epitaxial layer can be provided. The substrate 110 may comprise an alloy semiconductor such as silicon germanium, silicon germanium carbide, gallium arsenic phosphide, and gallium indium phosphide. In the present embodiment, the substrate 110 comprises P-type silicon. All doping may be implemented using a process such as ion implantation or diffusion in various steps. The substrate 110 may comprise The sensor 50 includes a plurality of pixels 100, such as $100_R$, $100_G$, and $100_B$, formed on the front surface of the semiconductor substrate 110. For example, the pixels shown in FIG. 2 are further labeled $100_R$, $100_G$, and $100_B$ to correspond with light wavelengths of red, green, and blue, respectively.

The sensor 50 further an interconnect structure 126, which includes layers, such as first metal layer 120 and second metal layers 122, contacts/vias 119, 121, 123. Interconnect structure 126 also includes inter-level dielectric (ILD) 124. The metal layers and vias could be formed by single or dual damascene process. If they are formed by dual damascene process, a metal layer, such as layer 122, and corresponding vias, such as vias 121, are formed by a deposition process, such as a plating process. Contacts 119 connect first metal layer 120 with device structures 115. FIG. 2 shows that contacts 119 connect to source/drain regions 114 of devices 115. However, contacts 119 may also connect to gate structures 113. Vias 123 connect interconnect structure 126 with pixel electrode layer 170, which is part of pixels 100. Devices 115 in different pixels 100 are separated by isolation structures 112, such as shallow trench isolation (STI) structures.

The ILD 124 includes multiple layers of dielectric films, which could include one or more low-k materials, as compared to a dielectric constant of silicon dioxide. ILD 124 may be made of carbon-doped silicon oxide, fluorine-doped silicon oxide, silicon oxide, silicon nitride, organic low-k material, or combinations thereof. The conductive material(s) of metal layers, such as 120 and 122, and contacts/vias 119, 121 and 123 may include aluminum, aluminum alloy, copper, copper alloy, tungsten, titanium, titanium nitride, tantalum, tantalum nitride, metal silicide, tungsten or combinations thereof.

Additional circuitry also exists to provide an appropriate functionality to handle the type of pixels 100 being used and the type of light being sensed. One of ordinary skill would understand that the wavelengths red, green, and blue are provided as examples, that different wavelength ranges are within the scope of this description, and that the pixels 100 include photodiodes 135 as photosensors. Photodiodes 135 include electrode layer 170 and a transparent electrode layer 177. Photodiodes 135 use organic semiconductor materials. Details of material layers used in forming organic photodiodes 135 are described below.

In some embodiments, there are light-blocking structures 125 between adjacent pixels 100. Light-blocking structures 125 block the transmission of light from neighboring color filters 160 and reduce cross-talk between different pixels, e.g., pixels $100_R$, $100_G$, or $100_B$.

The sensor 50 is designed to receive light 150 directed towards the front surface of the semiconductor substrate 110 during operation, reducing obstructions to the optical paths by other objects such as gate features and metal lines, and increasing the exposure of the light-sensing region to the illuminated light in comparison with other approaches. The light 150 may not be limited to visual light beam, but can be infrared (IR), ultraviolet (UV), or other electro-magnetic radiation wavelengths.

The sensor 50 further includes a color filter layer 160 formed over a passivation layer 130. The passivation layer 130 protects the pixels 100 from being damaged during the formation of color filters, such as $160_R$, $160_G$, and $160_B$, and micro-lenses 140. In some embodiments, passivation layer 130 is made of a dielectric material, such as silicon oxide, silicon nitride, silicon oxynitride, polymers, such as polyimide, polybenzoxazole (PBO), or benzocyclobutene-based (BCB-based) polymer, or a combination thereof. The color filter layer can support several different color filters (e.g., red, green, and blue), and may be positioned such that the incident light, e.g., light 150, is directed thereon and there through. In at least one embodiment, such color-transparent layers may be made of a polymeric material (e.g., negative photoresist based on an acrylic polymer) or resin. The color filter layer 160 may also be made of a negative photoresist based on an acrylic polymer including color pigments. In at least one embodiment, color filters $160_R$, $160_G$, and $160_B$ correspond to pixels $100_R$, $100_G$, and $100_B$, respectively.

The sensor 50 may include a number of micro-lenses 140 formed over color filters 160R, 160G, and 160B. Micro-lenses 140 focus light 150 toward pixels $100_R$, $100_G$, and $100_B$.

As mentioned above, image sensors using organic semiconductor materials which have a high QE and a low dark current have increased applicability. A mixture of N-type and P-type organic semiconductor materials may be used to form bulk heterojunction photodiodes. A bulk heterojunction photodiode exhibits a doner-acceptor phase separation over a short distance, such as in a range from about 10 nanometers (nm) to about 20 nm. The mixture of N-type and P-type organic semiconductor materials form a nanoscale interpenetrating network. As a result, each interface is within a distance less than the exciton diffusion length from the absorbing site. Bulk heterojunction photodiodes have high QE. However, bulk heterojunction photodiodes could suffer from high dark current.

Dark current is due to the random generation of electrons and holes within the depletion region of a photodiode when it is swept by high electric field. In order to reduce dark current, an electron-blocking layer(s) may be formed next to the anode and/or a hole-blocking layer(s) may be formed next to the cathode.

Figure 3:
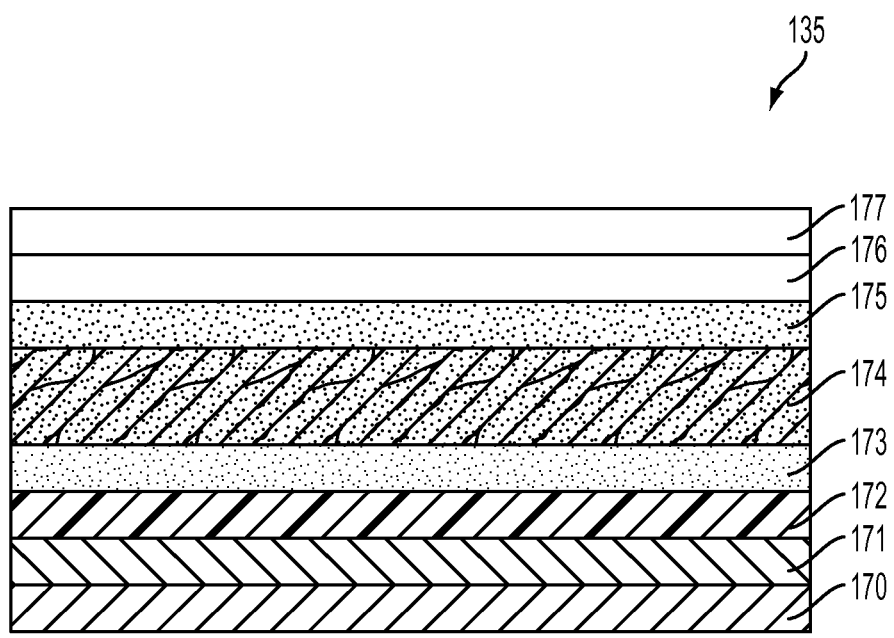
FIG. 3 is a cross-sectional view of a photodiode, in accordance with some embodiments.

FIG. 3 is a cross-sectional view of an organic photodiode 135, in accordance with some embodiments. Each photodiode 135 has two electrodes (an anode and a cathode). Photodiode 135 includes a pixel electrode layer 170, which is made of a conductive material and is formed over interconnect structure 126, as shown in FIG. 2. Electrode layer 170 forms the anode of the photodiode of pixel 100. The work function of the electrode layer 170 is in a range from about 4.5 eV to about 5.4 eV, in some embodiments. Electrode layer 170 may be made of, TiN, Au, Ag, Pt, or other applicable conductive materials. The thickness of electrode layer 170 is in a range from about 50 nm to about 150 nm, in some embodiments. In some embodiments, the electrode layer 170 is deposited by physical vapor deposition (PVD). However, other deposition methods, such as plating, chemical vapor deposition (CVD), or atomic layer deposition (ALD), may also be used.

As mentioned above, in order to reduce dark current, an electron-blocking layer may be formed next to the anode. Instead of a single electron-blocking layer, dual electron-blocking layers are used to achieve the purpose of dark current reduction.

The dual electron-blocking layers include a first electron-blocking layer 171 and a second electron-blocking layer 172. The first electron-blocking layer 171 is formed over electrode layer 170 and the second-electron blocking layer 172 is formed over the first electron-blocking layer 171. The HOMO is called highest occupied molecular orbital (HOMO) and the LUMO is called lowest unoccupied molecular orbital (LUMO). The first and second electron-blocking layers 171 and 172 provide HOMO values that assist the transport of holes during operation and LUMO values that assist blocking of electrons under reverse bias. Therefore, first electron blocking layer 171 and second electron blocking layer 172 may also be called hole-transport layers. In some embodiments, each of HOMO and LUMO of the electron-blocking layers 171 and 172 have a range of HOMO and LUMO values. The HOMO of first electron-blocking layer 171 is close to the work function of electrode layer 170. In some embodiments, the HOMO of first electron-blocking layer 171 is about equal to the work function of electrode layer 170. The HOMO of second electron-blocking layer 172 is close to the HOMO of organic P-type layer 173 to assist in hole-transporting. Therefore, second electron blocking layer 172 also functions as a hole-transport layer. Organic P-type layer 173 is formed over second electron-blocking layer 172.

LUMOs of both electron-blocking layers 171 and 172 are low to block electrons from reaching the cathode. Having dual electron-blocking layers allow two HOMOs, HOMOs of layers 171 and 172, to be close to the work functions of neighboring electrode layer 170 and organic P-type layer 173 to increase photocurrent through photodiode 135.

In some embodiments the LUMO of first electron blocking layer 171 is equal to or greater than about 2.2 eV. The difference between the LUMO of first electron block layer 171 and the work function of electrode layer 170 is sufficient for first electron blocking layer 171 to function as an electron-blocking layer. In some embodiments, the difference between the LUMO of first electron blocking layer 171 and the work function of electrode layer 170 is greater than about 2 eV (or $\Delta |171_{LUMO} - 170_{wk}| > 2$ eV). The ability of first electron blocking layer 171 to block electrons under reverse bias increases with the difference between the LUMO of first electron blocking layer 171 and the work function of electrode layer 170. In some embodiments, the difference between the LUMO of first electron blocking layer 171 and the work function of electrode layer 170 is equal to or greater than about 3 eV. As mentioned above, the HOMO of second electron blocking layer 172 is close to the HOMO of organic P-type layer 173 for second electron blocking layer 172 to provide a function of hole-transporting. In some embodiments, the difference between the HOMO of second electron blocking layer 172 and HOMO of organic P-type layer 173 is less than about 0.4 eV (or $\Delta |172_{HOMO} - 173_{HOMO}| < 0.4$ eV).

Figure 4:
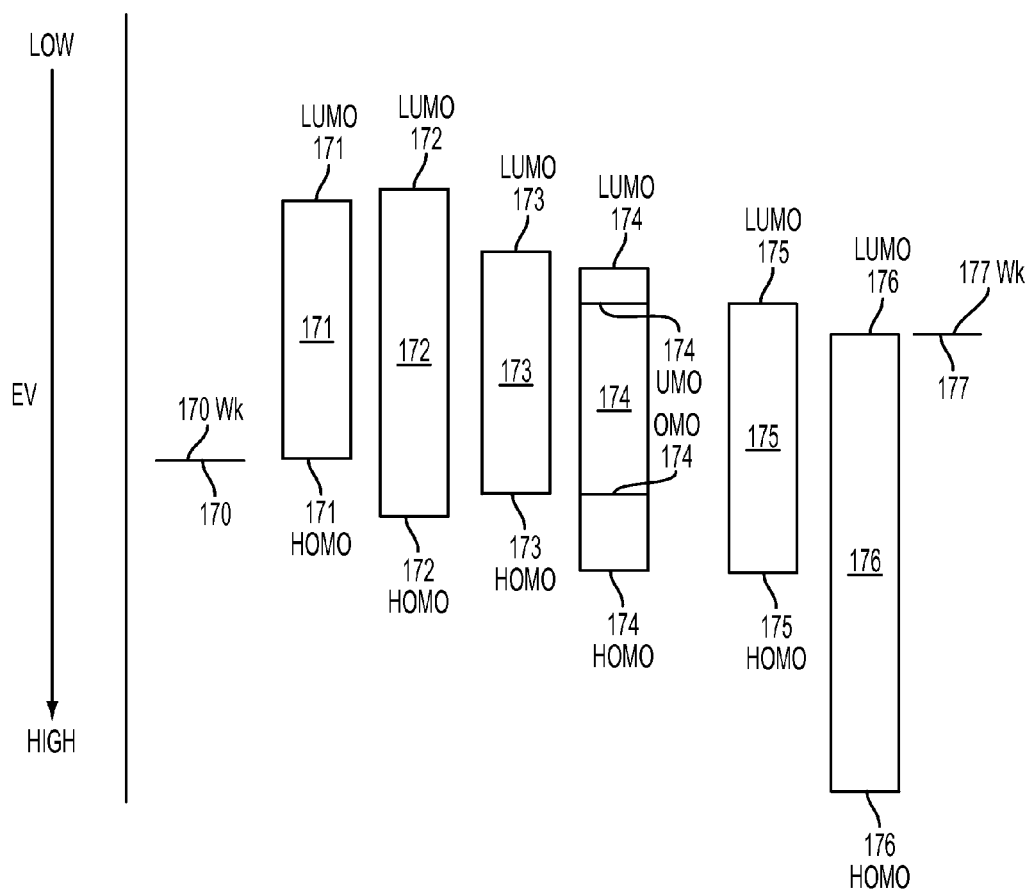
FIG. 4 is a graph of work functions and band diagrams of various layers in the photodiode of FIG. 3, in accordance with some embodiments.

The HOMO of first electron blocking layer 171 is in a range from about 4.5 eV to about 5.0 eV, in some embodiments. As mentioned above, the HOMO of first electron blocking layer 171 is close to the work function of electrode layer 170, as shown in FIG. 4 in accordance with some embodiments. In some embodiments, the first electron-blocking layer 171 is made of a non-organic material. First electron blocking layer 171 is made of $V_2O_5$ in some embodiments. However, other non-organic materials, such as metal oxides, with LUMO and HOMO in the ranges described above may also be used. In some embodiments, the LUMO of second electron blocking layer 172 is equal to or greater than about 2.2 eV and the HOMO of second electron blocking layer 172 is in a range from about 5.0 eV to about 5.5 eV. In some embodiments, the second electron-blocking layer 172 is made of a non-organic material. Second electron blocking layer 172 is made of $MoO_3$ in some embodiments. However, other non-organic materials, such as metal oxides, with LUMO and HOMO in the ranges described above may also be used.

The thicknesses of first electron blocking layer 171 or second electron blocking layer 172 is sufficiently thick to provide electron-blocking and/or hole-transport functions. However, each of first electron blocking layer 171 and second electron blocking layer 172 cannot to too thick, because a thicker layer increases the resistance of the layer and reduces photocurrent. The thickness of the first electron-blocking layer 171 is in a range from about 1 nm to about 30 nm, in some embodiments. The thickness of the second electron-blocking layer 172 is in a range from about 1 nm to about 30 nm, in some embodiments.

In some embodiments, first electron blocking layer 171 and second electron blocking layer 172 are deposited by physical vapor deposition (PVD). However, other deposition methods, such as plating, chemical vapor deposition (CVD) or atomic layer deposition (ALD), may also be used to form layers 171 and 172.

Organic P-type layer 173 is then formed over the second electron-blocking layer 172. The organic P-type layer 173 provides the functions of transporting holes under operation and blocking electrons under reverse bias condition. To provide the function of transporting holes, the HOMO of organic P-type layer 173 is close to the P-type HOMO of an organic active layer 174 formed over organic P-type layer 173, as shown in FIG. 4. The organic active layer 174 has a number of unoccupied and occupied molecular orbitals. To provide the function of blocking electrons under reverse bias, the LUMO of organic P-type layer 173 is significantly lower than the work function value of electrode layer 170. The LUMO of organic P-type layer 173 is about equal to (or close to) or slightly lower than the N-type LUMO of the organic active layer 174. If the LUMO of organic P-type layer 173 is lower than the P-type LUMO of the organic active layer 174, it helps to block electrons.

In some embodiments, the LUMO of organic P-type layer 173 is in a range from about 2.8 eV to about 3.2 eV and the HOMO of organic P-type layer 173 is in a range from about 5.0 eV to about 5.4 eV. In some embodiments, the bandgap of organic P-type layer 173 is in a range from about 2 eV to about 2.4 eV. The thickness of the organic P-type layer 173 is in a range from about 10 nm to about 50 nm, in some embodiments.

The organic P-type layer 173 is made of a P-type conjugated polymer, in some embodiments. The example, applicable the conjugated polymers include thiophene-based conjugated polymer, such as poly(3-hyxylthiophene) (P3HT), benzodithiophene-based conjugated polymer, thieno[3,4-c]pyrrole-4,6-dione (TPD)-based conjugated polymer, diketopyrrole-pyrrole (DPP)-based conjugated polymer, bithiazole (BTz)-based conjugated polymers, benzothiadiazole (BT)-based conjugated polymer, thieno[3,2-b]thiophene (TT)-based conjugated polymer, or a combination thereof. The organic P-type layer 173 may be formed by mixing the selected conjugated polymer(s), such as P3HT and an aromatic solvent(s), such as toluene and/or 1,2-dichlorobenzene, and then stirring the mixture at an elevated temperature. In some embodiments, the elevated temperature is at about 60° C. The mixture of conjugated polymer(s) and solvent (in liquid form) is then applied, such as by spaying with a nozzle, on the surface of the second electron-blocking layer 172. The solvent(s) is then driven out by evaporation.

After the organic P-type layer 173 is formed, the organic active layer 174 is formed over organic P-type layer 173. The organic active layer 174 is made of materials that form bulk heterojunction. The organic active layer 174 is made by blending one or more donor (or P-type) materials and one or more acceptor (or N-type) materials in a bulk volume to form a bulk heterojunction layer. P-N junctions are formed in the organic active layer 174. Holes and electrons are generated in the organic active layer 174 by absorbing light, e.g., light 150. The donor materials are made of P-type conjugated polymers. By using multiple donor materials and acceptor materials to form the bulk heterojunction layer (organic active layer 174), the bulk heterojunction layer (organic active layer 174) may have multiple HOMOs and LUMOs (N-type and P-type), which assist light absorption and increase photocurrent.

The P-type conjugated polymer candidates described above for the organic P-type layer 173 may be used as donor material(s) for forming organic active layer 174. The acceptor materials are made of N-type conjugated polymers, fullerene, or fullerene derivatives, in some embodiments. Materials made of fullerene derivatives can function as acceptors in photodiodes. The examples of the acceptor materials (or N-type materials) include, but are not limited to $C_{60}$, $C_{70}$, and [6,6]-phenyl C61 butyric acid methylester ($PC_{61}BM$) or $PC_{71}BM$. $C_{60}$ and $C_{70}$ are fullerenes and $PC_{61}BM$ and $PC_{71}BM$ are fullerene derivatives.

The donor material, the acceptor material, and an aromatic solvent(s), such as toluene and/or 1,2-dichlorobenzene, are mixed together, and then stirring the mixture at an elevated temperature, in some embodiments. In some embodiments, the elevated temperature is at least about 60° C. The mixture of conjugated polymer(s) and solvent (in liquid form) is then applied on the surface of the organic hole-transport layer 173. In some embodiments, the mixture is applied on the surface of organic P-type layer 173 by spin-coating or ink-jet printing. The solvent(s) is then driven out by evaporation and the organic active layer 174 is formed. The thickness of the organic active layer 174 is in a range from about 100 nm to about 500 nm, in some embodiments.

As mentioned above, the bulk heterojunction layer (layer 174) has multiple HOMOs and LUMOs. FIG. 4 shows organic active layer 174 with a number of HOMOs and LUMOs, in accordance with some embodiments. The HOMO of organic P-type layer 173 is close to a P-type HOMO of organic active layer 174. The LUMO of organic P-type layer 173 is lower than a P-type LUMO of organic active layer 174, as shown in FIG. 4 in accordance with some embodiments.

An organic N-type layer 175 is then deposited over the organic active layer 174 as shown in FIG. 3. The organic N-type layer 175 provides the functions of transporting electrons under operation and blocking holes under reverse bias condition. To provide the function of transporting electrons, the LUMO of organic N-type layer 175 is close to an N-type LUMO of organic active layer 174, as shown in FIG. 4. To provide the function of blocking holes under reverse bias, the HOMO of organic N-type layer 175 is significantly higher than the work function value of electrode layer 177 (cathode). The HOMO of organic N-type layer 175 is close to or slightly higher than the N-type HOMO of organic layer 174. When the HOMO of organic N-type layer 175 is higher than the N-type HOMO of organic layer 174, the organic N-type layer 175 helps to block holes under bias. The organic N-type layer 175 assists in transporting electrons to electrode layer 177 (cathode).

The organic electron-transport layer 175 includes an N-type conjugated polymer, a fullerene compound, or a fullerene derivative, in some embodiments. The N-type conjugated polymers, fullerenes, and fullerene derivatives described above for forming organic active layer 174 may be used to form organic N-type layer 175. The organic N-type layer 175 is transparent to allow incident light, e.g., light 150, to go through and hit the organic active layer 174 to form hole-electron pairs. In some embodiments the LUMO of organic N-type layer 175 is in a range from about 3.5 eV to about 4.5 eV and the HOMO of organic N-type layer 175 is in a range from about 6.0 eV to about 6.5 eV.

The thickness of the organic N-type layer 175 is in a range from about 10 nm to about 50 nm, in some embodiments. The organic N-type layer 175 may be formed by mixing the selected conjugated polymer(s), a fullerene, or a fullerene derivative with an aromatic solvent(s), such as toluene and/or 1,2-dichlorobenzene, and then stirring the mixture at an elevated temperature. In some embodiments, the elevated temperature is at least about 60° C. The mixture of conjugated polymer(s) and solvent (in liquid form) is then applied, such as by spaying with a nozzle, on the surface of the organic active layer 174. The solvent(s) is then driven out by evaporation.

The organic P-type layer 173 and organic N-type layer 175 next to the organic active layer 174 extends the function of organic active layer 174 at the interfaces with layers 173 and 175. As a result, the presence of layers 173 and 175 enhances the photocurrent of photodiode 135. In addition, organic P-type layer 173 and organic N-type layer 175 also help reduce dark current.

A hole-blocking layer 176 is then deposited over the organic N-type layer 175 as shown in FIG. 3, in accordance with some embodiments. The hole-blocking layer 176 also assists in transporting electrons to electrode layer 177 (cathode). The hole-blocking layer 176 is transparent to allow incident light (150) to go through transparent organic N-type layer 175 to reach organic active layer 174. In some embodiments, hole-blocking layer 176 is made a transparent material, such as LiF, $TiO_2$, ZnO, $Ta_2O_5$, $ZrO_2$, or a combination thereof. However, the materials suitable for the hole-blocking layer 176 are not limited to those described above.

In some embodiments, LUMO of the hole-blocking layer 176 is in a range from about 3.0 eV to about 4.5 eV and the HOMO of layer 176 is in a range from about 6.0 eV to about 8.5 eV. The LUMO of the hole-blocking layer 176 is close to LUMO of organic N-type layer 175 and also to the LUMO of electrode layer 177 to assist in electron transport to cathode (layer 177). HOMO of layer the hole-blocking layer 176 is significantly higher than the work function of electrode layer 177 (cathode) for its role of hole-blocking under reverse bias condition. In some embodiment, the difference between the HOMO of hole-blocking layer 176 and work function of electrode layer 177 is greater than about 2 eV (or $\Delta|176_{HOMO}-177_{wk}|>2$ eV). In some embodiment, the difference between the HOMO of hole-blocking layer 176 and work function of electrode layer 177 is greater than about 3 eV.

The thickness of the hole-blocking layer 176 is in a range from about 1 nm to about 30 nm, in some embodiments. In some embodiments, the hole-blocking layer 176 is deposited by physical vapor deposition (PVD). However, other deposition methods, such as plating, chemical vapor deposition (CVD) or atomic layer deposition (ALD), may also be used to form hole-blocking layer 176.

After the hole-blocking layer 176 is deposited, a transparent electrode layer 177 is deposited over hole-blocking layer 176. The electrode layer 177 is transparent to allow light, e.g., light 150, to go through and is conductive to function as an electrode. Examples of suitable transparent electrode layer 177 include, but are not limited to, indium tin oxide (ITO), indium zinc oxide (IZO), indium gallium zinc oxide (IGZO), etc. In some embodiments, layer 177 is deposited by physical vapor deposition (PVD). However, other deposition processes, such as chemical vapor deposition (CVD) or atomic layer deposition (ALD), or other applicable processes, may also be used.

In some embodiments, the thickness of electrode layer 177 is in a range from about 50 nm to about 300 nm. In some embodiments, the work function of electrode layer 177 is in a range from about 4.5 eV to about 5.5 eV.

As mentioned above, there are light-blocking structures 125 between photodiodes 135. After transparent electrode layer 177 is deposited, a patterning process is performed to remove the material layers, such as layers 170-177, between photodiodes 135. The patterning process includes forming a photoresist layer (not shown), with openings that correlate to isolation structures 125, and etching the material layers to remove the material layers of pixels 100 under the openings. After etching is completed, the remaining photoresist layer is removed. A non-transparent dielectric material is then deposited to fill the openings and to form light-blocking structures 125.

FIG. 5 is a table of performance data of various electron-blocking layer(s) for organic photodiodes similar to photodiode 135 of FIG. 3, in some embodiments. Except the first electron-blocking layer 171 and second electron blocking layer 172, other layers of the organic photodiodes constructed to generate data in FIG. 5 are similar and have been described above in the description of FIG. 3. Four different types of electron-blocking layers are used in place of the first electron-blocking layer 171 and the second electron-blocking layer 172 of FIG. 3. The first type of electron blocking layer (I) is poly(ethylene-dioxythiophene) doped with polystyrene-sulfonic acid (or PEDOT:PSS), which is an organic electron-blocking layer and has been used as an electron-blocking layer for photodiodes. The second type of electron blocking layer (II) is a 10 nm $V_2O_5$ layer. As described above, $V_2O_5$ is used for first electron-blocking layer 171. However, for the data in FIG. 5 for option (II), only first electron-blocking layer 171 (single layer) is used. Second electron-blocking layer 172 is not used in option (II). The third type of electron blocking layer (III) is a 10 nm $MoO_3$ layer. As described above, $MoO_3$ is used for second electron-blocking layer 172. However, for the data in FIG. 5 for option (III), only second electron-blocking layer 172 (also single layer) is used. First electron-blocking layer 171 is not used in option (III). The fourth type of electron blocking layer (IV) uses dual electron-blocking layers (first electron blocking layer 171 and second electron blocking layer 172) with 10 nm of $V_2O_5$ and 2 nm of $MoO_3$.

Data in FIG. 5 indicates that the option IV of an organic photodiode using dual electron-blocking layers yielded the lowest dark current density (7.8E-8 A/cm$^2$), compared to the other three options. Dark current density is defined as current of a photodiode under a reverse bias voltage. The dark current data in FIG. 5 are collected at a reverse bias voltage of −1V. Dark current of a photodiode may also be measured at other reverse bias voltage. In this case, a reverse bias voltage of −1 V is chosen for comparing photodiodes with different configurations. The dark current data indicates that dual electron-blocking layers (option IV) reduce dark current to a lowest value compared to single layer electron-blocking layer using poly(3,4-ethylenedioxythiophene):poly(styrenesulfonate) (or PEDOS:PSS), $V_2O_5$, or $MoO_3$. The dark current of the photodiode with the dual electron-blocking layers is 1 to 2 magnitudes lower than the other 3 options (Options I, II, and III).

The data in FIG. 5 also indicates that the photodiode with dual electron-blocking layers (option IV) performing better than the other three options (I, II, and III) in detectivity (D*). Further, the data in FIG. 5 indicates that the photodiode with dual electron-blocking layers (option IV) performing comparably with the other three options (I, II, and III) in photocurrent density (bias=−1V), EQE (external quantum efficiency, λ=550 nm, bias=−1V), responsivity, and signal to noise ratio (ρ, cm$^2$/A, 0V~−1V). The data also indicates that the photodiode with dual electron-blocking layers (option IV) performing better than the other three options (I, II, and III) in detectivity (D*, λ=550 nm, bias=−1V). Therefore, the photodiode with dual electron-blocking layers indicate good photodiode characteristics with best dark current result.

EQE measures the percentage of external photons hitting device's photoreactive surface that produce charge carriers, as shown in equation (1).

$$EQE = electrons/exitons = 1240 \times J_{ph}(\lambda)/\lambda \times P_{inc} \qquad (1)$$

$J_{ph}(\lambda)$ is photo current at wavelength of λ, which is generated by an incident photon $P_{inc}$. In the example in FIG. 5, λ=550 nm. Responsivity, R(λ), measures how responsive the photodiode is in generating photocurrent and is calculated according to equation (2).

$$R(\lambda) = J_{ph}(\lambda)/P_{inc} = EQE \times \lambda/1240 \qquad (2)$$

In the example in FIG. 5, λ=550 nm. Detectivity (D*) measures the effectiveness of photon detection, and is related to responsivity, as described in equation (3).

$$D^* = R/(2qJ_d)^{1/2} = (J_{ph}/L_{light})/(2qJ_d)^{1/2} \qquad (3)$$

R is the responsivity, q is an absolute value of electron charge (1.6×10$^{-19}$ coulombs), $J_d$ is dark current, $J_{ph}$ is the photocurrent, and $L_{light}$ is light intensity.

The data in FIG. 5 indicates that organic photodiodes with dual electron-blocking layers significantly reduce dark current density and improve detectivity, compared to organic photodiodes with the other 3 types of electron-blocking layers. As mentioned above, low dark current is useful for photodetectors. Dark current density with a value about 7.8E-8 A/cm2 is equivalent to non-organic photodiodes, which makes organic photodiodes using dual electron-blocking layers next to the anode viable device options for production.

Embodiments of forming an image sensor with an organic photodiode are provided. The organic photodiode uses dual electron-blocking layers formed next to the anode of the organic photodiode to reduce dark current. By using dual electron-blocking layers, the values of highest occupied molecular orbital (HOMO) for the neighboring anode layer and the organic electron-blocking layer are matched by one of the dual electron-blocking layers to form a photodiode with good performance. The values of the lowest occupied molecular orbital (LOMOs) of the dual electron-blocking layers are selected to be much lower than the neighboring anode layer to reduce dark current.

In some embodiments, an organic photodiode is provided. The organic photodiode includes a first electrode layer, and a first electron-blocking layer formed over the first electrode layer. The organic photodiode also includes a second electron-blocking layer formed over the first electron-blocking layer, and an organic P-type layer. The organic photodiode further includes an organic active layer, an organic N-type layer, and a second electrode layer.

In some other embodiments, an organic photodiode is provided. The organic photodiode includes a first electrode layer, and a first electron-blocking layer formed over the first electrode layer. The organic photodiode also includes a second electron-blocking layer formed over the first electron-blocking layer, and an organic P-type layer. The photodiode further includes an organic active layer, and the organic active layer forms bulk heterojuction. The organic active layer is made of a blend of P-type conjugated polymers with N-type conjugated polymers or fullerene derivatives. In addition, the photodiode includes an organic N-type layer, an electron-transport layer, and a second electrode layer.

In yet some other embodiments, a method of forming an organic photodiode is provided. The method includes forming a first electrode layer, forming a first electrode layer, and forming a first electron-blocking layer over the first electrode layer. The method also includes forming a second electron-blocking layer over the first electron-blocking layer, and forming an organic P-type layer. The method further includes forming an organic active layer, and forming an organic N-type layer. In addition, the method includes forming a hole-blocking layer, and forming a second electrode layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An organic photodiode, comprising:
   a first electrode layer having a first work function;
   a first electron-blocking layer of $V_2O_5$ over the first electrode layer, wherein the first electron-blocking layer has a first value of highest occupied molecular orbital (HOMO), wherein the first value of HOMO is substantially equal to the first work function;
   a second electron-blocking layer of $MoO_3$ over the first electron-blocking layer, wherein the second electron-blocking layer includes a metal-oxide having a second value of HOMO, and wherein the second electron-blocking layer is thinner than the first electron-blocking layer;
   an organic P-type layer over the second electron-blocking layer, wherein the organic P-type layer has a third value of HOMO, the third value and the second value having a difference of less than approximately 0.4 eV;
   an organic active layer over the organic P-type layer;
   an organic N-type layer over the organic active layer; and
   a second electrode layer over the organic N-type layer.

2. The organic photodiode of claim 1, further comprising:
   a hole-blocking layer between the second electrode layer and the organic N-type layer.

3. The organic photodiode of claim 1, wherein the organic P-type layer comprises a P-type conjugated polymer.

4. The organic photodiode of claim 3, wherein the organic P-type layer comprises at least one of a thiophene-based conjugated polymer, a benzodithiophene-based conjugated polymer, a thieno[3,4-c]pyrrole-4,6-dione (TPD)-based conjugated polymer, a diketo-pyrrole-pyrrole (DPP)-based conjugated polymer, bithiazole (BTz)-based conjugated polymers, a benzothiadiazole (BT)-based conjugated polymer, a thieno[3,2-b]thiophene (TT)-based conjugated polymer, or a combination thereof.

5. The organic photodiode of claim 1, wherein the organic P-type layer comprises poly(3-hyxylthiophene) (P3HT).

6. The organic photodiode of claim 1, wherein the organic N-type layer comprises an N-type conjugated polymer, a fullerene, or a fullerene derivative.

7. The organic photodiode of claim 1, wherein the organic active layer comprises P-N junctions.

8. The organic photodiode of claim 1, wherein the organic active layer comprises a blend of one or more P-type conjugated polymers and one or more N-type conjugated polymers or fullerene derivatives.

9. The organic photodiode of claim 2 wherein the organic N-type layer, the hole blocking layer and the second electrode layer are transparent.

10. The organic photodiode of claim 1, wherein the second electron-blocking layer has a LUMO lower the work function of the first electrode layer by at least 2 eV.

11. The organic photodiode of claim 1, wherein the organic active layer is a blend of materials of the organic N-type layer and materials of the organic P-type layer, wherein organic active layer is a bulk heterojunction.

12. The organic photodiode of claim 1, wherein the organic photodiode is part of an image sensor with the second electrode layer being exposed to incident light.

13. An organic photodiode, comprising:
   a first electrode layer;
   a first electron-blocking layer of $V_2O_5$ formed over the first electrode layer, the first electron-blocking layer having a first highest occupied molecular orbital (HOMO) substantially similar to a work function of the first electrode layer;
   a second electron-blocking layer of $MoO_3$ having a second HOMO value formed over the first electron-blocking layer, the second electron-blocking layer being thinner than the first electron-blocking layer;
   an organic P-type layer over the second electron-blocking layer, the organic P-type layer having a third HOMO value at least 0.4 eV less than the second HOMO value;
   an organic active layer over the organic P-type layer, wherein the organic active layer is a bulk heterojunction, and wherein the organic active layer comprises a blend of P-type conjugated polymers with N-type conjugated polymers or fullerene derivatives;
   an organic N-type layer over the organic active layer;
   a hole-blocking layer over the organic N-type layer, the hole-blocking layer having a LUMO substantially similar to a work function of a second electrode layer; and
   the second electrode layer over the hole-blocking layer.

14. An image sensor comprising:
   an organic photodiode for receiving light incident on the image sensor, wherein the organic photodiode comprises:
   a first electrode layer having a material with a work function value;
   a first electron-blocking layer over the first electrode layer comprising $V_2O_5$ having a first highest occupied molecular orbital (HOMO) value substantially equal to the work function value;
   a second electron-blocking layer over the first electron-blocking layer comprising $MoO_3$ having a second HOMO value, wherein the second electron-blocking layer is thinner than the first electron-blocking layer;
   an organic P-type layer over the second electron-blocking layer, wherein the organic P-type layer has a third HOMO value that is less than about 0.4 eV different that the second HOMO value;
an organic active layer over the organic P-type layer;
an organic N-type layer over the organic active layer; and
a second electrode layer over the organic N-type layer.

15. The image sensor of claim 14, further comprising an interconnect structure electrically connected to the organic photodiode, wherein the interconnect structure is located on an opposite side of the organic photodiode from the incident light.

16. The organic photodiode of claim 1, wherein the first electron-blocking layer is about 10 nm and the second electron-blocking layer is about 2 nm.

17. The organic photodiode of claim 2, wherein the hole-blocking layer has a first lowest unoccupied molecular orbital (LUMO) value; the first LUMO value substantially equal to a work function of the second electrode layer.

18. The organic photodiode of claim 17, wherein the hole-blocking layer comprises at least one of LiF, $TiO_2$, ZnO, $TaO_5$, and $ZrO_2$.

19. The organic photodiode of claim 1, wherein the first layer has a thickness of approximately 10 nanometers (nm) and the second layer has a thickness of approximately 2 nm.

* * * * *